(12) United States Patent
Sunter

(10) Patent No.: US 6,211,803 B1
(45) Date of Patent: Apr. 3, 2001

(54) TEST CIRCUIT AND METHOD FOR MEASURING SWITCHING POINT VOLTAGES AND INTEGRAL NON-LINEARITY (INL) OF ANALOG TO DIGITAL CONVERTERS

(75) Inventor: Stephen Kenneth Sunter, Nepean (CA)

(73) Assignee: LogicVision, Inc., San Jose, CA (US)

( * ) Notice: Subject to any disclaimer, the term of this patent is extended or adjusted under 35 U.S.C. 154(b) by 0 days.

(21) Appl. No.: 09/191,154

(22) Filed: Nov. 12, 1998

(51) Int. Cl.[7] .............................. H03M 1/10; H03M 1/06
(52) U.S. Cl. ............................................ 341/120; 341/118
(58) Field of Search ..................................... 341/120, 118, 341/155, 143, 161, 165

(56) References Cited

U.S. PATENT DOCUMENTS

| | | |
|---|---|---|
| 4,009,475 | 2/1977 | DeFreitas . |
| 4,503,465 | 3/1985 | Wine . |
| 5,382,956 * | 1/1995 | Baumgartner et al. ............... 341/155 |

OTHER PUBLICATIONS

Ehsanian et al, "A New Digital Test Approach for ADC Testing," IEEE, 60–65, 1996.*
Ting et al., "A Practical Implementation of Dynamic Testing of an ADC," IEEE, 238–243, 1996.*
Arabi, K. and Kaminska, B., "Oscillation Built–In Self Test (OBIST) Scheme for Functional and Structural Testing of Analog and Mixed–Signal Integrated Circuits," *IEEE Int'l. Test Conf.*, 1997, pp. 786–795.
Hassan IHS, et al., "Testing Digital to Analog Converters Based on Oscillation–Test Strategy Using Sigma–delta Modulation", Conference on Computer Design, Sep. 1998.

"DSP–Based Testing of analog and Mixed–Signal Circuits" by Matthew Mahoney, pp. 122–123, published 1987, The Computer Society Press, Washington DC.

* cited by examiner

*Primary Examiner*—Patrick Wamsley
(74) *Attorney, Agent, or Firm*—Skjerven Morrill MacPherson LLP

(57) ABSTRACT

A circuit and method is described whose objective is built-in self-test (BIST) for analog-to-digital converters (ADCS) and input logic gates of an integrated circuit. The technique converts the switching point voltage, or logic threshold, into a binary-encoded digital value which can be compared to upper and lower limits to decide pass or fail. Every clock cycle, the output of the ADC is compared to a digital output value, and if the output is larger than the reference a logic 0 is output, otherwise a logic 1. This series of ones and zeroes is fed back to an analog low pass filter connected to the ADC's input, and also to a digital averaging circuit which counts the number of ones in a constant interval. The number of ones is linearly proportional to the switching point voltage. Measuring the switching point voltages for a multi-bit ADC allows on-chip calculation of the differential non-linearity (DNL), the integral non-linearity (INL) and the maximum DNL and INL can be compared against upper limits to determine whether the ADC passes or fails the test.

30 Claims, 11 Drawing Sheets

Logic Gate

Negative feedback

CE: Count Enable
Ck: Clock Input
Cout: Carry Out
EN: Enable Latching

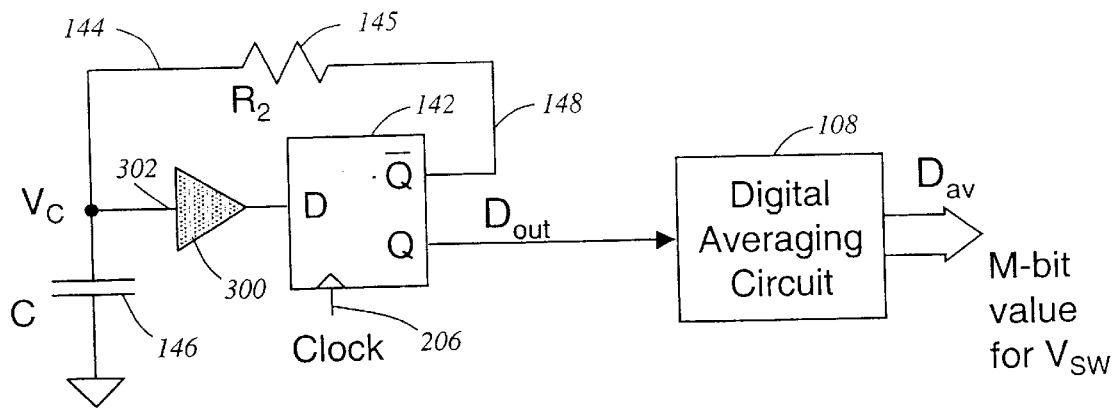
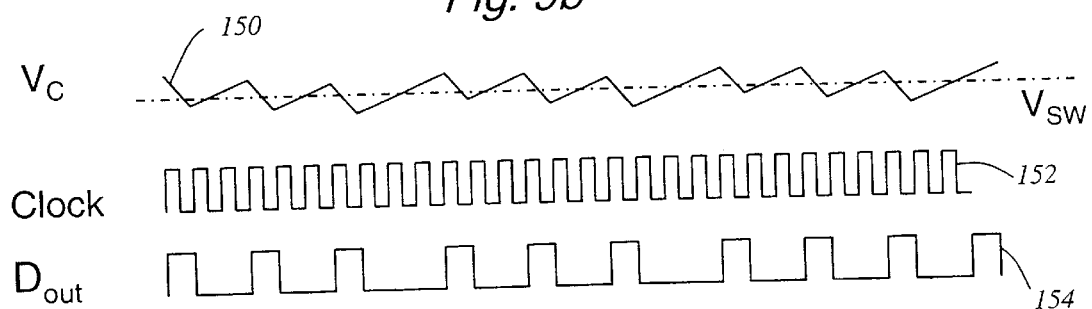
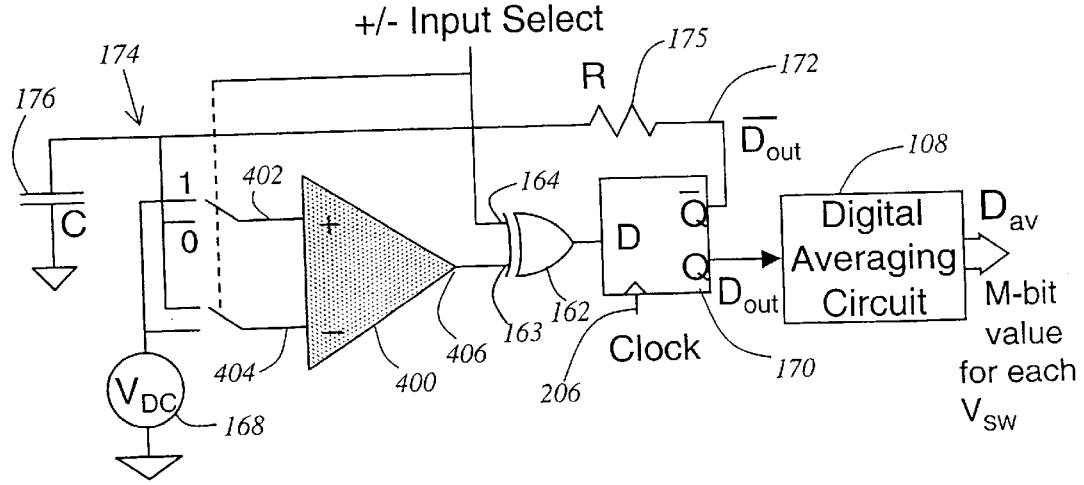

TEST CIRCUIT AND METHOD FOR MEASURING SWITCHING POINT VOLTAGES AND INTEGRAL NON-LINEARITY (INL) OF ANALOG TO DIGITAL CONVERTERS

This invention relates to a test circuit and method for testing Analog to Digital Converters (ADCs), and more particularly, to a test circuit and method for measuring switching point voltages, Integral Non-Linearity (INL) and Differential Non-Linearity (DNL) of ADCs.

BACKGROUND OF THE INVENTION

Analog to digital converters (ADCs) are used in many electronics applications. Complex ADCs can convert analog signals into an N-bit binary-encoded digital value, and comprise hundreds or thousands of transistors and other passive elements. Other ADCs are as simple as, e.g., a 7-transistor comparator or 2-transistor logic inverter. Herein, N is a positive integer.

A key parameter of interest for any ADC is the voltage above which a specific digital output is generated, and below which a different digital output is generated. This value is commonly referred to as a switching point voltage, $V_{SW}$, and is illustrated graphically in FIG. 1b.

For 1-bit converters, such as a logic gate 20 shown in FIG. 2a, the switching point voltage $V_{SW}$ is typically mid-way between the power supply voltage ($V_{DD}$ or $V_{CC}$) and ground ($V_{SS}$ or Gnd) as shown in FIG. 2b. In a logic gate, 20 the switching point voltage $V_{SW}$ is also called a logic threshold.

A comparator 30 shown in FIG. 3a is also a 1-bit converter. The comparator 30 has a non-inverting input 32 and an inverting input 34. As shown in FIG. 3b, the switching point voltage $V_{SW}$ for either input 32, 34 of the comparator 30 is approximately equal to the adjustable DC voltage $V_{DC}$ 36 connected to the other input 34, 32 of the comparator 30.

For N-bit converters whose digital output is N bits wide, there are $2^N-1$ switching point voltages, one between each of the $2^N$ possible voltage ranges corresponding to a unique digital output code. The voltage difference between each measured switching point voltage $V_{SW}$ and the ideal switching point voltage $V_{SW}$ is the INL. All of the $2^N$ voltage ranges, or step sizes, should be equal except the first and last ranges; the difference between any step and the ideal step size is referred to as the DNL. DNL and INL are key measures of an ADC's quality. For example, in a 2-bit ADC 10 shown in FIG. 1a, there are 3 switching point voltages $V_{SW1}$, $V_{SW2}$ and $V_{SW3}$ as shown in FIG. 1b. The DNL of the ADC 10 is the difference between the ideal step size $(V_{max}-V_{min})/(2^N-1)$ and each voltage range: between $V_{SW1}$ and $V_{SW2}$ 14, and between $V_{SW2}$ and $V_{SW3}$ 16; the first and last ranges 12 and 18 are not counted. DNL having the largest deviation from the ideal value is reported as the maximum DNL.

Conventionally, when N is less than 10, the switching point voltage $V_{SW}$ is measured by ramping the input voltage to an ADC relatively slowly from a low value to a high value, and recording the voltage at which the digital output of the ADC suddenly changes state. When N is 10 or larger, this test method is often impractical because of noise. For example, for a 5 volt full-scale input range and 10 bits resolution, each of the 1024 voltage ranges is only 5/1023= 4.88 millivolts wide. Peak-to-peak noise can easily exceed this voltage width in a test environment. An alternative method, in this case, is to record a histogram of the output digital codes for an adjustable DC voltage input, and to then record each input voltage for which the histogram has a mean equal to each digital output code. This measurement method requires generation of very accurate voltages by the tester, and is relatively slow.

Another method is to provide a stimulus waveform comprising an asynchronous, periodic linear ramp, and to record the histogram for all output values from the ADC—ideally each bin of the histogram will contain the same count, so deviations indicate non-linearity. This method requires a very linear stimulus and a significant amount of digital storage, e.g. $2^{N+6}$ bits provide $2^N$ bins with a maximum bin count of $2^6=64$, which equals 64K bits for a 10-bit ADC.

A sigma-delta (or delta-sigma) ADC is able to achieve many bits of resolution and yet a single-order converter uses only a single comparator and analog integrator. One implementation of the front-end 40 of such a converter is shown in FIG. 4a. The front end circuit 40 comprises a flip-flop 42 receiving a clock signal, and an analog integrator including two resistors 44 and 46 having resistance $R_1$ and $R_2$ and a capacitor 48 having capacitance C. When an input voltage $V_{in}$ to the circuit 40 is not equal to the switching point voltage $V_{SW}$ of the ADC, the voltage $V_C$ changes with the waveform like line 49a shown in FIG. 4b. The output of the circuit 40 changes with the waveform like line 49c. The clock signal is shown in line 49b. One possible implementation of such a sigma-delta ADC is disclosed in U.S. Pat. No. 4,009,475 issued February, 1977 to DeFreitas. In the output signal $D_{out}$, the proportion of ones, or zeroes, in a selected number of clock cycles is linearly related to the input voltage $V_{in}$ and to the resistance ratio $R_1/R_2$ of the resistors 44 and 46, but is insensitive to the capacitance C of the capacitor 48. The circuit 40 is a front end of an ADC, and not a testing device for measuring the switching point voltage.

FIG. 5 shows a circuit 50 disclosed in U.S. Pat. No. 4,503,465 issued March, 1985 to Wine. The circuit 50 generates a bias voltage $V_b$ at the input to a logic gate 52 which is equal to the switching point voltage $V_{SW}$ of the logic gate 52. The circuit 50 uses digital circuitry 54 plus a resistor 56 having resistance $r_4$ and a capacitor 58 having capacitance $C_b$. The circuit 50 is a digital implementation of an analog signal comparator, comparing $V_{in}$ to reference voltage $V_{ref}$. This is a comparator or converter, and not a testing device for measuring the switching point voltage as a means of testing the circuit.

A method for measuring DNL for an ADC is disclosed by Arabi and Kaminska in IEEE ITC'97 Proceedings, pp. 786–95, and shown in FIG. 6. A circuit 60 is disclosed in which the output of a self-timed ADC 62 is compared to two digital references by a control logic circuit 64. The result of the comparison is connected to a current source/sink circuit 66 which is connected to a source voltage $V_{DD}$ and a sink voltage $V_{SS}$. The output of the current source/sink circuit 66 drives a capacitor 68 having capacitance C and the input of the ADC 62. The circuit 60 oscillates at a frequency $f_{OSC}$. The oscillation period minus four times the conversion period of the ADC 62, times the source/sink current value $I_{souce}/I_{sink}$, divided by twice the capacitance C, is equal to the voltage step that the two digital references represent. However, in this method, the measurement is dependent on the capacitance C and current of the current source/sink circuit 66, and the conversion time of the ADC.

It is therefore desirable to provide a circuit for measuring switching point voltages, INL and DNL of an ADC, which is simple and independent of the conversion time of the ADC, and independent of the exact value of the resistance R and capacitance C.

SUMMARY OF THE INVENTION

An object of the present invention is to provide a circuit for measuring switching point voltages, INL and DNL of an ADC, which is simple and independent of the exact values and delays of the components used.

To this end, the present invention uses negative feedback to an analog input voltage of the ADC so as to keep the analog input voltage as close as possible to a switching point voltage of the ADC.

In accordance with an aspect of the present invention, there is provided a test circuit for measuring a switching point voltage of an N-bit analog-to-digital converter (ADC) having an analog input and a digital output. The test circuit comprises a digital feedback circuit, an analog averaging circuit and a digital averaging circuit. The digital feedback circuit samples a digital value from the digital output of the ADC, and generates a digital feedback value. The analog averaging circuit receives the digital feedback value, and averages the digital feedback value to provide an analog average value as an analog input voltage to the analog input of the ADC. The digital average circuit receives the digital feedback value, and averages the digital feedback value to generate a digital average value which is representative of the switching point voltage.

In accordance with another aspect of the present invention, there is provided a method for measuring a switching point voltage of an N-bit analog-to-digital converter (ADC) having an analog input and a digital output. The method starts receiving a digital value from the digital output of the ADC, and generating a digital feedback value. A voltage of the digital feedback value is averaged to provide an analog average value to the analog input of the ADC. The digital feedback value is digitally averaged to generate a digital average value which is representative of the switching point voltage.

BRIEF DESCRIPTION OF THE DRAWINGS

The invention will be further understood from the following description with reference to the drawings in which:

FIG. 1b is a graph showing the output voltage versus the input voltage, and $V_{SW}$ for the ADC shown in FIG. 1a;

FIG. 2b is a graph showing the output voltage versus the input voltage, and $V_{SW}$ for the logic gate shown in FIG. 2a;

FIG. 3b is a graph showing the output voltage versus the input voltage, and $V_{SW}$ for the comparator shown in FIG. 3a;

FIG. 4b is a chart showing waveforms for the circuit shown in FIG. 4a;

FIG. 9a is a block diagram showing an embodiment of a circuit for measuring $V_{SW}$ for a logic gate;

FIG. 9b is a chart showing an example of waveforms for the circuit shown in FIG. 9a;

FIG. 10 is a block diagram showing an embodiment of a circuit for measuring $V_{SW}$ for a comparator;

FIG. 12b is a chart showing example waveforms for the circuit shown in FIG. 12a.

DETAILED DESCRIPTION OF THE PREFERRED EMBODIMENTS

A test circuit and method for testing an ADC of the present invention is comparable in accuracy to tests which are typically implemented using automatic test equipment (ATE), but is simple enough to automatically and economically include within an integrated circuit containing the ADC and thus facilitate built-in self-test (BIST). The test circuit is connected only to the normal input and output signals of the ADC, hence does not interfere with internal circuitry of the ADC. Also, the test circuit is insensitive to the normal parametric variations to which the integrated circuit is subjected. All of the BIST circuitry, except some elements of an analog averaging circuit which provides an analog input voltage to the ADC, can be described using a hardware description language (HDL), and synthesized and laid out in an integrated circuit design using commercially available software. Therefore, the test circuit design facilitates automation of BIST.

The test circuit measures a switching point voltage $V_{SW}$, INL and DNL of an ADC. The switching point voltage $V_{SW}$ is a voltage separating the voltage range for a digital output value $D_1$ from that for its neighboring digital output value $D_1-1$. Measuring the switching point voltage $V_{SW}$ for each of selected, consecutive digital output values allows determination of INL and DNL for the ADC.

The test circuit and the method of the present invention may be used for testing a sampling or clocked ADC or an un-clocked ADC such as a 1-bit ADC.

Figure 7A:
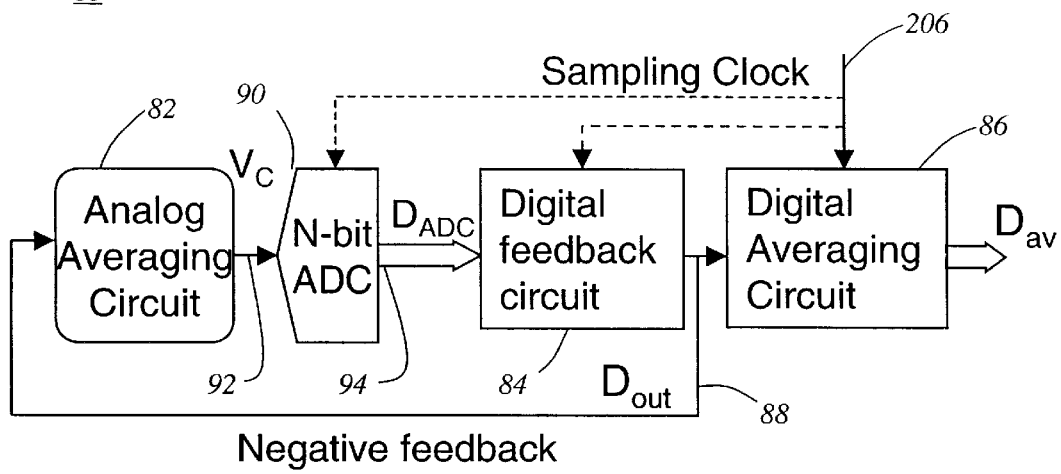
FIG. 7a is a block diagram showing an embodiment of a test circuit in accordance with the present invention.

FIG. 7a shows an embodiment of a test circuit 80 in accordance with the present invention.

The test circuit 80 measures a switching point voltage $V_{SW}$ of an N-bit ADC 90. The test circuit 80 comprises an analog averaging circuit 82 which provides an analog input voltage $V_C$ as a stimulus to an analog input 92 of the ADC 90. The analog input voltage $V_C$ is digitally derived from a digital output 94 of the ADC 90. A digital output value $D_{ADC}$ output from the digital output 94 of the ADC 90 is received by a digital feedback circuit 84. The digital feedback circuit 84 provides a digital feedback value $D_{out}$ to the analog averaging circuit 82. The analog averaging circuit 82 averages the digital feedback value $D_{out}$ and generates an analog average value. The analog average value is input to the analog input 92 of the ADC 90 as the analog input voltage $V_C$. Thus, the digital feedback value $D_{out}$ provides negative feedback 88 to the analog input voltage $V_C$ in such a way that the analog input voltage $V_C$ is kept as close as possible to the switching point voltage $V_{SW}$. The digital feedback value $D_{out}$ is independent of a current of the analog averaging circuit 82 and the conversion time of the ADC.

The digital feedback value $D_{out}$ is also input to a digital averaging circuit 86. The digital averaging circuit 86 averages the digital feedback value $D_{out}$ to provide a digital average value or a binary-encoded digital value $D_{av}$. Thus, the switching point voltage $V_{SW}$ of the ADC 90 is converted into a binary-encoded digital value $D_{av}$. The binary-encoded digital value $D_{av}$ is compared to preset upper and lower limits to decide pass or fail of the ADC.

Figure 7B:
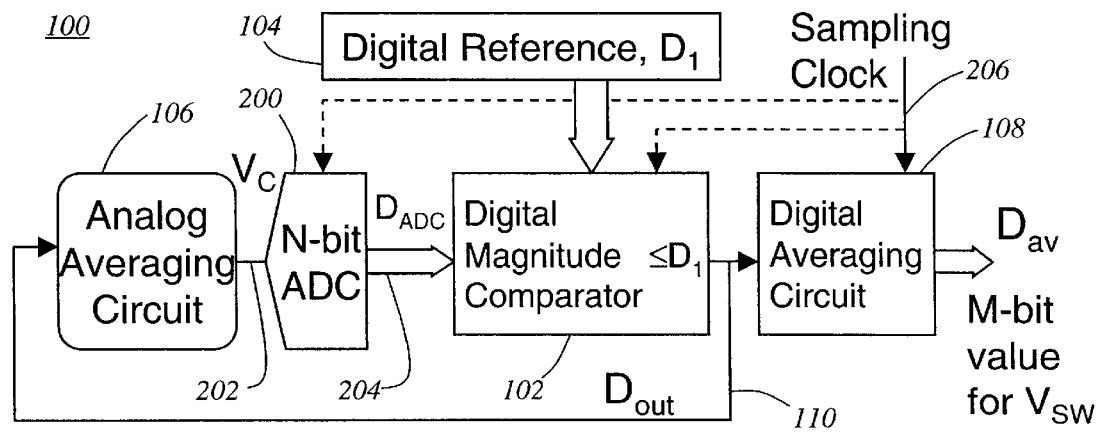
FIG. 7b is a block diagram showing another embodiment of a test circuit in accordance with the present invention.

Referring to FIG. 7b, another embodiment of a test circuit 100 in accordance with the present invention for measuring switching point voltages $V_{SW}$ of an N-bit ADC 200 is described, explicitly showing means for selecting which switching point will be measured; in this case it will be that corresponding to digital output value $D_1$.

To test the ADC 200, the test circuit 100 is connected to an analog input 202 and a digital output 204 of the ADC 200. The ADC 200 in FIG. 7b and the ADC 90 in FIG. 7a may sample their input at a rate determined by sampling clock 206, or may convert continuously without need for a sampling clock. The digital feedback circuit 84 in FIG. 7a and the digital magnitude comparator 102 in FIG. 7b may be clocked to generate an output synchronous to the sampling clock, or un-clocked in which case the output switches asynchronously.

An analog input voltage $V_C$ is input to the analog input 202 and is digitally derived from the digital output 204. A digital output value $D_{ADC}$ output from the digital output 204 is input to a digital magnitude comparator 102. The digital magnitude comparator 102 also receives a selected digital reference code $D_1$ from a digital reference input unit 104. The digital output value $D_{ADC}$ of the ADC 200 is compared to the reference code $D_1$. The digital magnitude comparator 102 generates a feedback value or logic value $D_{out}$ in accordance with the comparison result. In this embodiment, the logic value $D_{out}$ is a logic 1 when the ADC output $D_{ADC}$ is less than or equal to the digital reference code $D_1$, and a logic 0 when the ADC output $D_{ADC}$ is greater than $D_1$.

The logic value $D_{out}$ output from the digital magnitude comparator 102 provides negative feedback 110 to the analog input voltage $V_C$. That is, the logic value $D_{out}$ is input to an analog averaging circuit 106. The analog averaging circuit 106 averages the logic value $D_{out}$ to provide an analog average value to the ADC as the analog input voltage $V_C$. In other words, the logic value $D_{out}$ drives the analog averaging circuit 106 in such a way as to keep the capacitor voltage $V_C$ as close as possible to a switching point voltage $V_{SW}$ of the selected reference code $D_1$.

When the analog input voltage $V_C$ exceeds the switching point voltage $V_{SW}$, then the feedback logic value $D_{out}$ is logic 0, which drives the analog input voltage $V_C$ lower. When $V_C$ falls below the switching point voltage $V_{SW}$, then the feedback logic value $D_{out}$ becomes logic 1, which drives the analog input voltage $V_C$ higher.

Figure 7C:
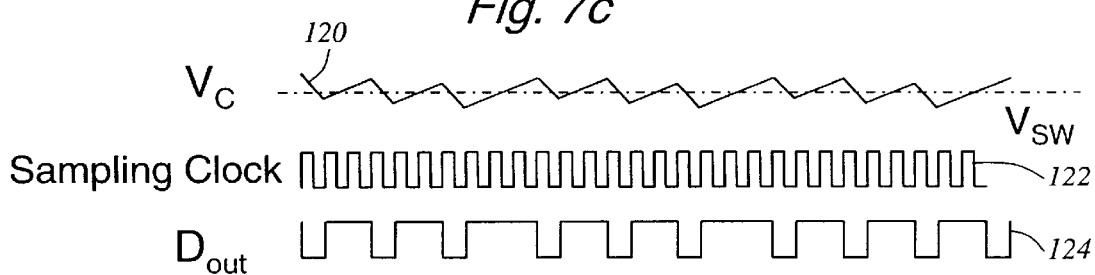
FIG. 7c is a chart showing an example of waveforms for the circuit shown in FIG. 7b.

The logic value $D_{out}$ is updated once per clock cycle of the sampling clock 206. Thus, every clock cycle, the digital magnitude comparator 102 generates logic 0 or logic 1. This series of ones and zeroes is fed back to the analog averaging circuit 106. The test circuit 100 generates waveforms like lines 120 and 124 shown in FIG. 7c. Line 122 shows the sampling clock.

Referring back to FIG. 7b, the output $V_C$ of the analog averaging circuit 106 is connected to the analog input 202 of the ADC 200.

The digital logic value $D_{out}$ output from the digital magnitude comparator 102 is also input to a digital averaging circuit 108. The digital averaging circuit 108 averages the digital logic value $D_{out}$, and generates a digital average value $D_{av}$.

The digital average value $D_{av}$ is equal to the ratio of the switching point voltage $V_{SW}$ to the voltage difference between logic 1 and logic 0.

The digital averaging circuit 108 may count the number of ones in a constant interval to derive the digital average value $D_{av}$. The number of ones is linearly proportional to the switching point voltage $V_{SW}$ of the ADC. In other words, the number of logic ones in the logic value $D_{out}$ as a proportion of the number of clock cycles in any chosen interval (e.g. 1024 clock cycles) is equal to the switching point voltage $V_{SW}$ divided by the voltage difference between logic 1 and logic 0. Thus, the switching point voltage $V_{SW}$ is obtained from the digital average value $D_{av}$ output from the digital averaging circuit 108. The number of logic ones in the logic value $D_{out}$ is relatively insensitive to values of elements, such as a resister or capacitor, of the analog averaging circuit 106 or the clock period of the sampling clock 206.

Measuring the switching point voltages for a multi-bit ADC allows on-chip calculation of the DNL. The maximum DNL may be compared against an upper limit to determine whether the ADC passes or fails the test.

The digital magnitude comparator 102 is a standard digital function and may comprise e.g. TTL 7485.

The digital reference $D_1$ may be any digital code for which the switching point voltage $V_{SW}$ is to be measured.

The analog averaging circuit 106 may be an analog low pass filter or integrator comprising a resistor having resistance R and a capacitor having capacitance C (not shown). The value of the RC time constant, i.e. a product of resistance R times capacitance C in units of time of the digital magnitude comparator 102, is preferably much greater than the clock period of the sampling clock 206. Thus, the waveform of the analog input voltage $V_C$ can be ensured to comprise linear segments. Hence the analog averaging circuit 106 acts as a near-ideal integrator. It is, however, possible to cancel any non-linearity in the segments by using two different clock periods, one of which is twice the other. This is because the measurement error is proportional to the clock period, when the switching point voltage $V_{SW}$ is not equal to $V_{DD}/2$. When the switching point voltage $V_{SW}$ equals $V_{DD}/2$, the numbers of ones and zeroes in the logic value $D_{out}$ are always equal for any clock period and interval.

For a logic output which switches between $V_{DD}$ and ground (i.e. 0 volts), the average value of the feedback logic value $D_{out}$ becomes equal to $V_{SW}/V_{DD}$.

The digital average value $D_{av}$ may be measured by the digital averaging circuit 108 over any period of time. The longer the period of time, the better the accuracy. For example, if the digital average value $D_{av}$ is averaged for an interval of 256 clock cycles, then 8-bits resolution can be achieved, or approximately +/−0.4%. If the digital average value $D_{av}$ is averaged for an interval of 1024 clock cycles, then 10-bits resolution can be achieved, or approximately +/−0.1%. The resolution is independent of the values of the resistor and capacitor of the analog averaging circuit 106.

Figure 8A:
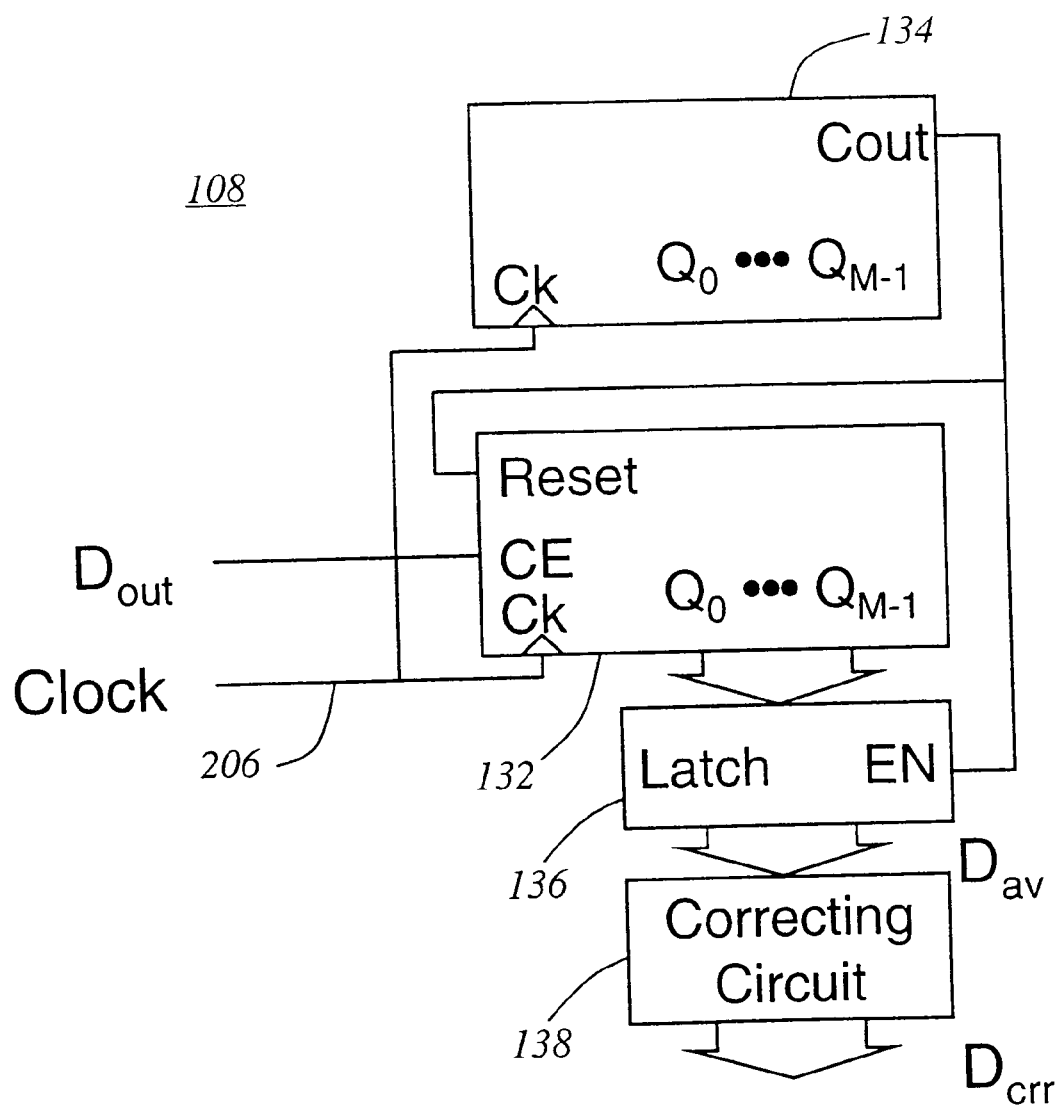
FIG. 8a is a block diagram showing an example of a digital averaging circuit, which counts the number of ones in a chosen number of clock cycles.

FIG. 8a shows an example of the digital averaging circuit 108. The digital averaging circuit 108 counts the number of ones generated by the digital magnitude comparator 102 within a prescribed interval. The digital averaging circuit 108 comprises two counters: a ones-counter 132 and a clock counter 134. The ones-counter 132 receives the logic value $D_{out}$ and counts the ones in the logic value $D_{out}$ in accordance with the clock received at the clock input Ck. The clock counter 134 receives the clock at its clock input Ck and counts the clock cycles. When a prescribed number of clock cycles $2^M$ is reached, the clock counter 134 generates a carry out signal from an output $C_{out}$ to an enable latching input EN of an output register 136. This causes the output of the ones-counter 132 to be loaded into the output register 136. The output register 136 in turn outputs an M-bit value $D_{av}$. The M-bit value $D_{av}$ equals the number of clock cycles in which the logic value is one, out of every $2^M$ cycles. The carry out signal generated from the clock counter 134 is also input into the ones-counter 132 to reset the counter 132.

Figure 8B:
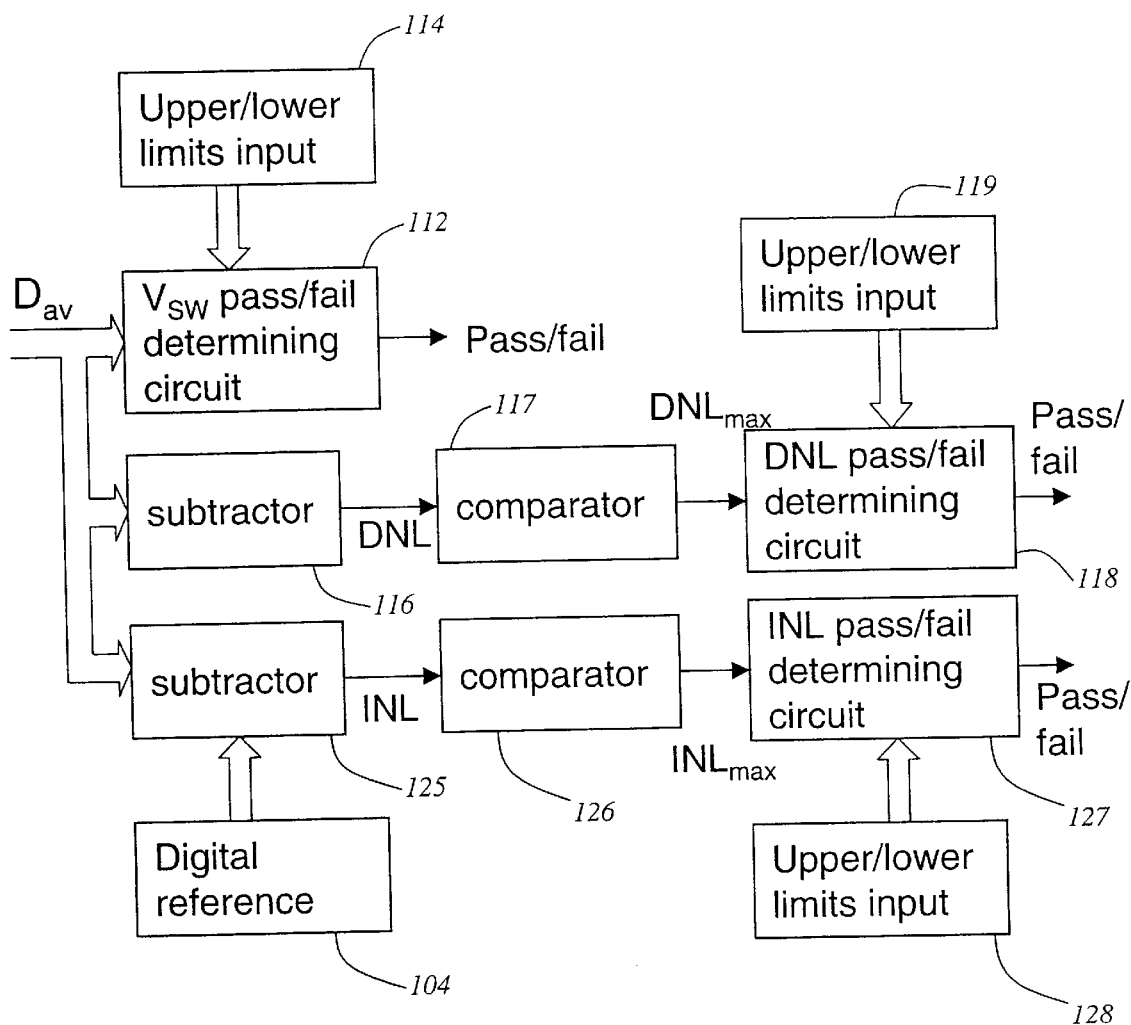
FIG. 8b is a block diagram showing an example of a pass/fail determining circuit.

As shown in FIG. 8b, the test circuit 100 may also comprise a $V_{SW}$ pass/fail determining circuit 112. The determining circuit 112 receives the digital average value $D_{av}$ and preset upper and lower limits of the switching point voltage $V_{SW}$ from an upper/lower limit input unit 114. The determining circuit 112 compares the received digital average value $D_{av}$ with the upper and lower limits, and determines whether the ADC passes or fails the test. The result may be generated as one bit or two bits including one bit for the upper limit and the other bit for the lower limit.

Figure 1A:
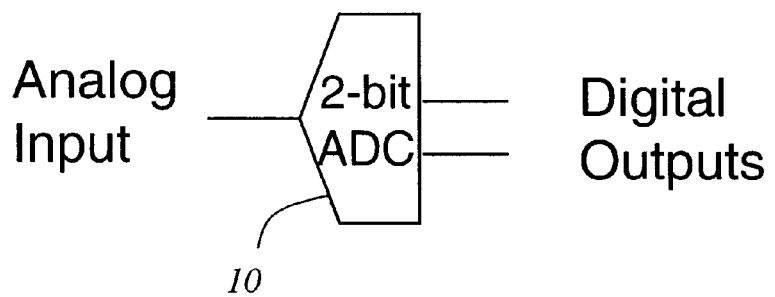
FIG. 1a is a block diagram showing a 2-bit ADC.
Figure 1B:
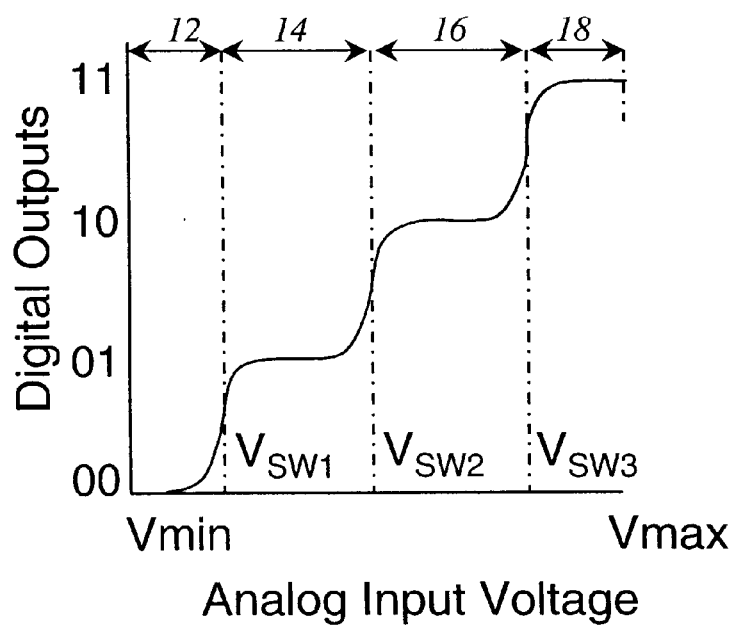
Figure 2A:
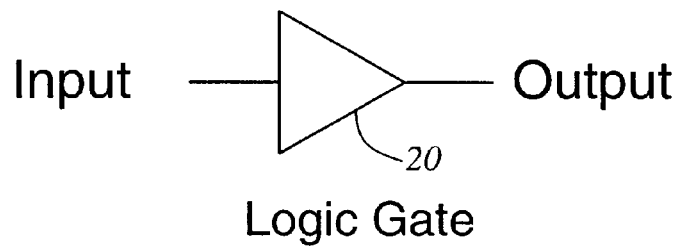
FIG. 2a is a block diagram showing a logic gate.
Figure 2B:
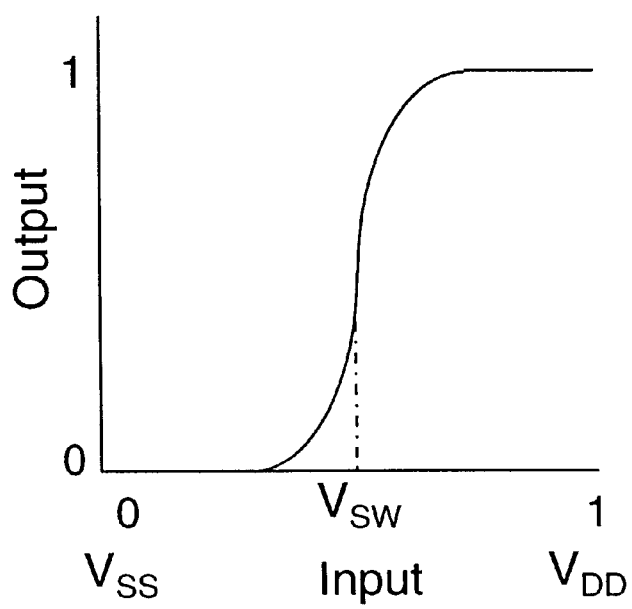
Figure 3A:
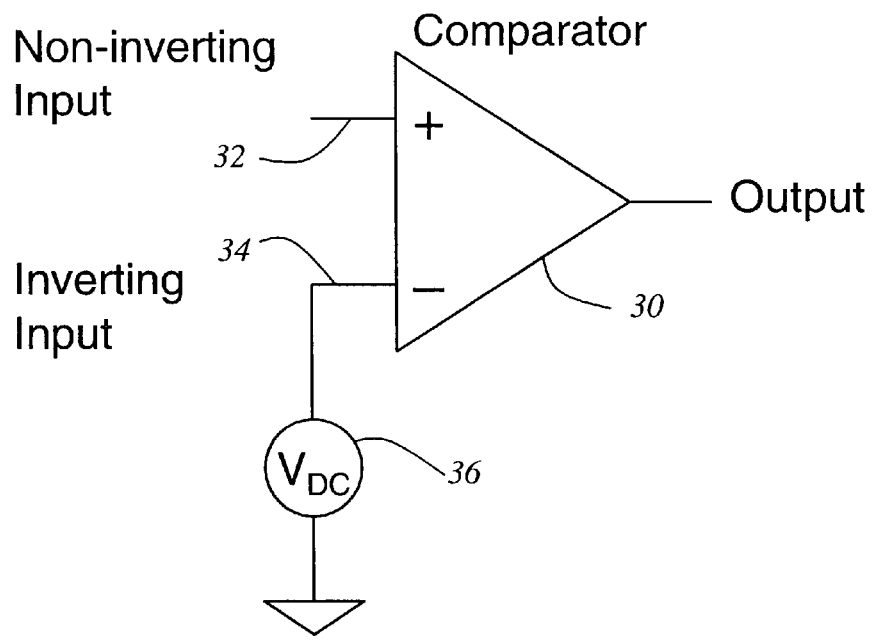
FIG. 3a is a block diagram showing a voltage comparator with controllable $V_{SW}$.
Figure 3B:
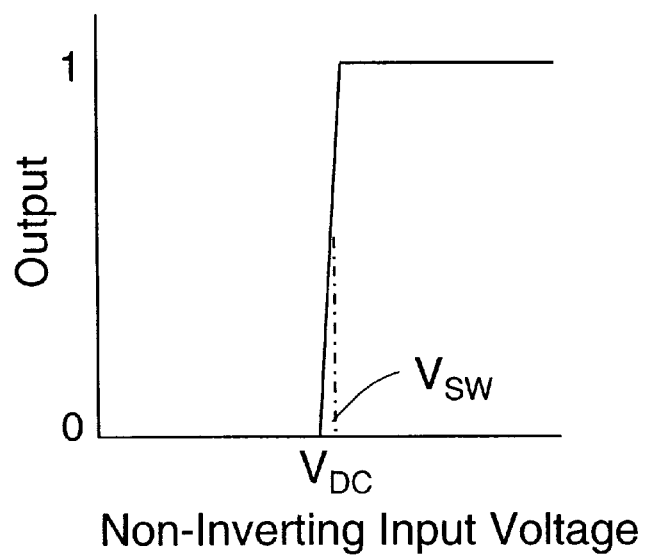
Figure 4A:
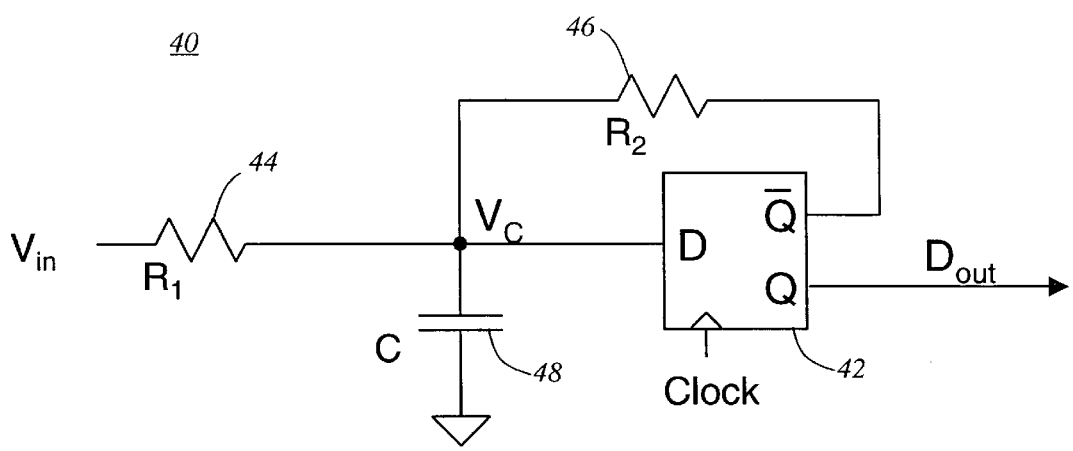
FIG. 4a is a block diagram showing a prior art implementation of part of a sigma-delta ADC.
Figure 4B:
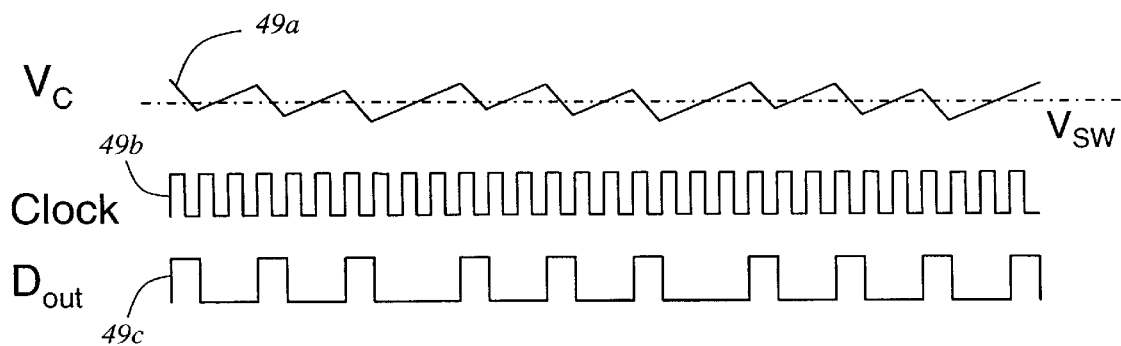
Figure 5:
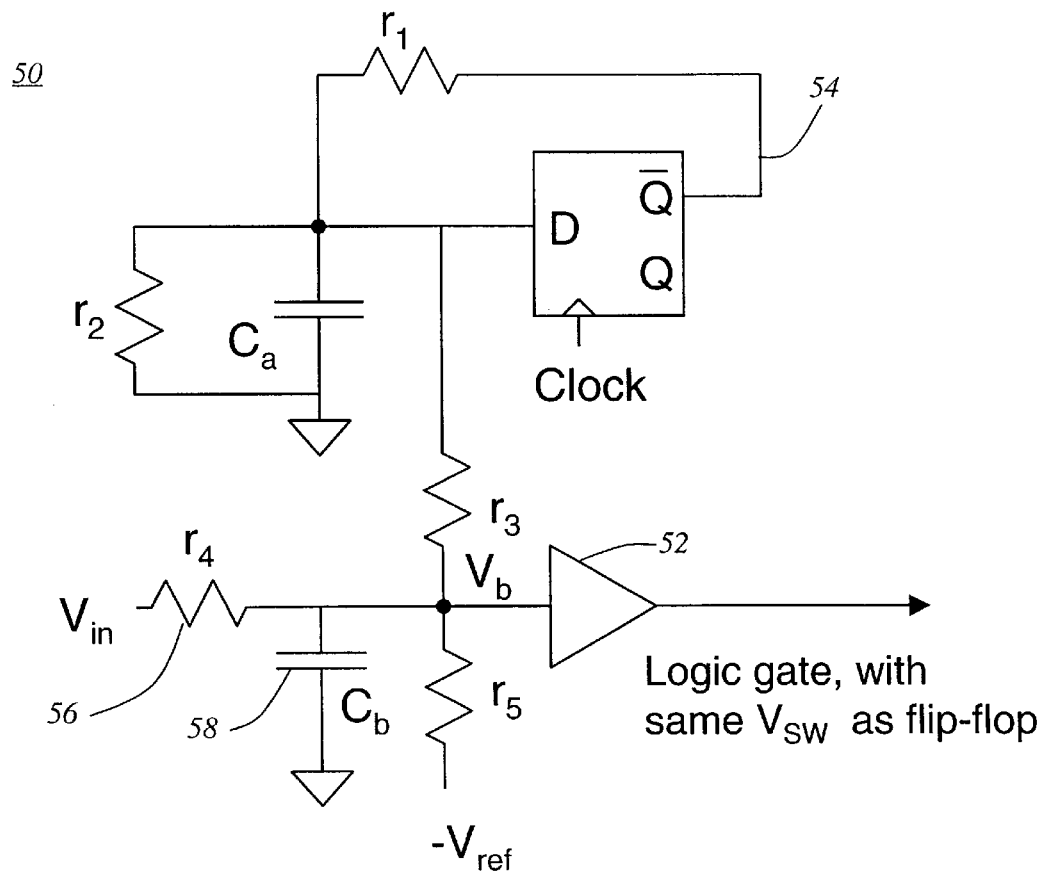
FIG. 5 is a block diagram showing a prior art circuit for digitally generating a bias voltage equal to the switching point voltage.

The test circuit of the present invention uses a similar principle to the ADC shown in FIG. 5. However, the objective of the test circuit is to measure the switching point voltage $V_{SW}$ as means of testing the circuit. The test circuit of the present invention does so in a way which produces a binary-encoded digital number $D_{av}$ with arbitrary precision, and compares this number to upper and lower binary-encoded digital limits to produce a pass or fail result.

Figure 6:
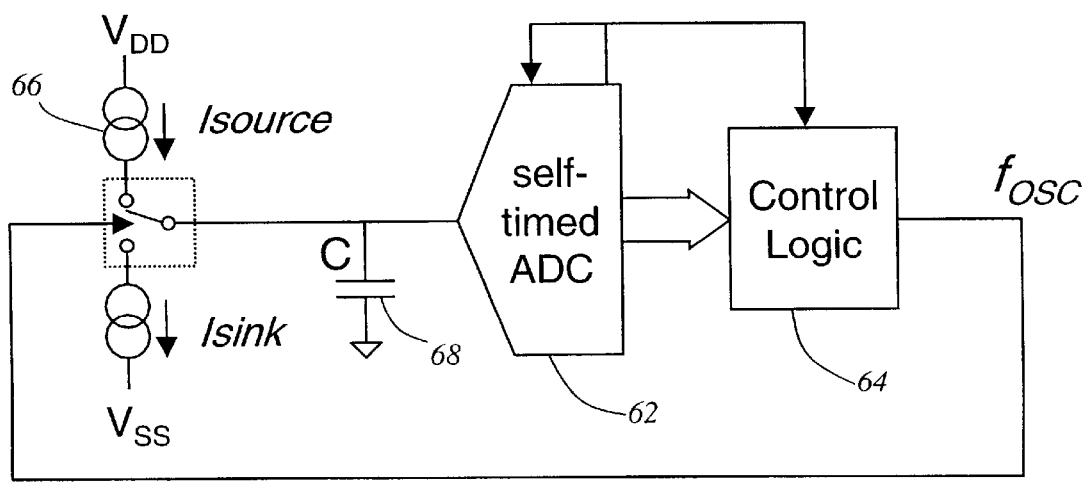
FIG. 6 is a block diagram showing a prior art circuit for measuring DNL of an ADC.

Further, the test circuit of the present invention uses a principle different from that of the method shown in FIG. 6. In the test circuit of the present invention, a measurement is independent of the capacitance and current of the analog averaging circuit, and the conversion time of the ADC.

To test a non-clocked ADC which converts continuously, it is preferable to provide a sampling circuit for sampling the ADC. A clocked digital register or a flip-flop may be suitably used.

A logic gate 300 shown in FIG. 9a or a comparator 400 shown in FIG. 10 is in essence a 1-bit ADC. To test such a 1-bit ADC, the digital magnitude comparator 102 shown in FIG. 7b or the digital feedback circuit 84 shown in FIG. 7a may be a simple inverter or a wire. This is because the function of comparing the digital output of the 1-bit ADC to a pre-determined value is implicit in the logic of the 1-bit ADC.

FIG. 9a shows an embodiment of a test circuit 140 for testing the logic gate 300. The test circuit 140 comprises a D-type flip-flop 142 to sample a digital output value $D_{ADC}$ of the logic gate 300. The flip-flop 142 receives a clock. The combination of the logic gate 300 and the flip-flop 142 forms a sampling ADC. An inverted output value $\overline{D}_{out}$ from an inverted output $\overline{Q}$ of the flip-flop 142 is used for negative feedback to an analog averaging circuit 144 via a wire 148. The analog averaging circuit 144 comprises a resistor 145 having resistance R and a capacitor 146 having capacitance C. Thus, the analog input voltage $V_C$ to an analog input 302 of the logic gate 300 is kept as close as possible to a switching point voltage $V_{SW}$ of the logic gate 300. The test circuit 140 generates the waveforms like lines 150 and 154 shown in FIG. 9b. Line 152 shows the clock 206.

The output value $D_{out}$ of the flip-flop 142 is input into a digital averaging circuit 108 which generates an M-bit value $D_{av}$ for the switching point voltage $V_{SW}$ of the logic gate 300.

The logic gate 300 under test may be inverting or non-inverting, as long as the appropriate output of a flip-flop or a clocked digital register is used for negative feedback to the analog input voltage $V_C$ to the logic gate 300. That is, the feedback must be inverted relative to the analog input voltage $V_C$.

FIG. 10 shows an example of a test circuit 160 for testing an analog comparator 400. The test circuit 160 enables testing the switching point voltage $V_{SW}$ of either plus or minus input 402, 404 of the comparator 400. That is, when one input 402 or 404 is connected to a constant DC voltage 168 and is not switched, then the switching point voltage $V_{SW}$ of the comparator 400 is measured in the same way as the logic gate 300 shown in FIG. 9a. The offset voltage of the comparator 400 is half the difference between the two measured switching point voltages $V_{SW}$ for the plus and minus inputs 402, 404. Therefore, the test circuit 160 can measure the offset voltage of the comparator 400.

The output 406 of the comparator 400 is connected to an input 163 of an exclusive OR gate 162. The other input 164 of the exclusive OR gate 162 receives an input select signal 166. The input select signal 166 selects the plus input 402 or the minus input 404 of the comparator 400 under test. The non-selected input 402 or 404 is connected to the constant DC voltage 168. The output of the exclusive OR gate 162 is input to a D-type flip-flop 170. The flip-flop 170 receives a clock.

As in the test circuit 140 shown in FIG. 9a, an inverted output value $\overline{D}_{out}$ from an inverted output $\overline{Q}$ of the flip-flop 170 is used for negative feedback to an analog averaging circuit 174 via a wire 172. The analog averaging circuit 174 comprises a resistor 175 having resistance R and a capacitor 176 having capacitance C. Thus, the analog input voltage $V_C$ to the selected input 402 or 404 of the comparator 400 is kept as close as possible to a switching point voltage $V_{SW}$ for the selected input 402 of the comparator 400.

The output value $D_{out}$ from an output Q of the flip-flop 170 is input into a digital averaging circuit 108 which generates an M-bit value for the switching point voltage $V_{SW}$ for the selected input of the comparator 400.

Instead of using the D-type flip-flop 142 or 170, any type of clocked flip-flop or digital register may be used.

In general, a more accurate value for a switching point voltage $V_{SW}$ for an ADC is the value measured for one clock frequency, minus the difference between the value measured for that clock frequency and the value measured for one half that clock frequency. Accordingly, it is preferable to measure those two values to improve accuracy of the measurement.

For example, assuming a 1 volt full-scale input range, if the switching point voltage $V_{SW}$ measured is 150/256 for a clock period of 20 ns (50 MHz), and 160/256 for a clock period of 40 ns (25 MHz), then the corrected value for the switching point voltage $V_{SW}$ is calculated as follows:

[150−(160−150)]/256=140/256=0.547 volts.

Similarly, if the switching point voltage $V_{SW}$ measured is 110/256 for a clock period of 20 ns, and 100/256 for a clock period of 40 ns, then the corrected value for the switching point voltage $V_{SW}$ is calculated as follows:

[110−(100−110)]/256=120/256=0.469 volts.

In order to perform the correction of the switching point voltage $V_{SW}$, the digital averaging circuit 108 may further comprise a correcting circuit 138 as shown in FIG. 8*a*. The correcting circuit 138 calculates a difference between a digital average value $D_{av1}$ measured at a predetermined clock frequency and another digital average value $D_{av2}$ measured at a higher clock frequency than the predetermined clock frequency. Then, the correcting circuit 138 corrects the digital average value $D_{av1}$ in accordance with the difference to generate a corrected value $D_{crr}$. The addition of the correcting circuit 138 is optional: the smaller the clock period relative to the product of R and C, the less the accuracy improvement achieved by the correcting circuit.

Measuring ADCs may be carried out with various full-scale ranges. In the above description, the ADCs shown in FIGS. 9*a* and 10 are assumed to have a lower limit to its full-scale input range equal to the logic 0 voltage, and an upper limit equal to the logic 1 voltage. Differences in the range may be accommodated by using a resistive divider (not shown) or by using a duty cycle different from unity to represent a logic 1 and different from zero to represent a logic 0.

For example, the analog averaging circuit 144 or 174 may be provided with an additional resistor (not shown) which is connected across the capacitor 146 or 176 C and has an equal resistance to the resistor 145 or 175. Such an additional resistor reduces the maximum analog input voltage $V_C$ by 50%. Other resistor values may be used to achieve an arbitrary range. The range must be less than the logic voltage swing of the ADC under test. The resistor ratio of resistance R of the resistor 145 or 175 and that of the additional resistor must be appropriately accurate.

An alternative way to generate smaller voltage ranges, without requiring additional or accurate resistors, is to use a constant duty cycle to represent each logic value. For example, instead of feeding back a logic 0, the feedback may comprise a bit sequence of 0100 which is a 25% duty cycle. Similarly, instead of feeding back a logic 1, the feedback may comprise a bit sequence of 0111 which is a 75% duty cycle. In this way, an ADC full-swing input range of half of the logic 0 to logic 1 voltage swing, and centered around the same mid-point, can be accommodated. The effective clock rate is changed for every one time that the analog input voltage is sampled. Four digital bits in sequence are applied to the resistor 145 or 175. This change has minimal effect on the results, especially when the accuracy improvement scheme described in reference to FIG. 8*a* is used.

In order to measure Integral Non-Linearity (INL), the test circuit of the present invention measures the switching point voltage $V_{SW}$ for a digital value.

Referring back to FIG. 7*b*, the test circuit sets the digital reference $D_1$ to the digital value. The measurement is typically done with at least 2 bits higher resolution than the ADC under test. For example, when testing an 8-bit ADC, 10 bits resolution is preferably needed. Accordingly, 1024 or more cycles are counted when measuring each switching point voltage $V_{SW}$. When testing a 10-bit ADC, 4096 or more cycles are preferably counted for each switching point voltage $V_{SW}$.

When the analog feedback is driven by a buffer whose logic 1 and 0 output voltages are equal to the maximum and minimum input voltages of the ADC, the digital difference between the measured switching point voltage $V_{SW}$ and the digital code is the INL for that digital code. For example, if for reference code 00010000, the measured switching point voltage $V_{SW}$ is 0001000011, then the INL is equal to the switching point voltage $V_{SW}$ code minus the reference code, after right-shifting the reference code by the number of bits of extra resolution, i.e. 2 bits in this case, which equals 0000000011. The binary decimal point is left-shifted by 2 bits to interpret the answer: 0.11 (binary)=0.75 (decimal). The units in both cases are Least Significant Bits (LSB).

Typically the switching point voltage $V_{SW}$ for every digital code is measured, and the largest deviation from the ideal value reported as the maximum INL, in units of LSB.

The maximum INL may be determined by a subtractor 125, a comparator 126 and an INL pass/fail determining circuit 127 as shown in FIG. 8*b*. The subtractor 125 also receives the digital reference value $D_1$, and subtracts the digital average value $D_{av}$ measured from the digital reference value $D_1$. The comparator 126 compares the subtraction result with that for other selected reference values to determine the maximum INL. The determining circuit 127 determines if the ADC passes or fails by comparing the maximum INL with preset upper and lower limits received from an INL upper/lower limits input unit 128.

In order to measure DNL, the test circuit measures the switching point voltage $V_{SW}$ for pairs of successive digital values.

Referring to FIG. 7*b*, the test circuit sets the digital reference $D_1$ to successive digital values. As for INL, these measurements are typically done with at least 2 bits higher resolution than the ADC under test.

Ideally, in an N-bit ADC, each step size between two neighboring switching point voltages is equal to the input voltage range of the analog input voltage $V_C$ divided by the number of least significant bits (LSB) steps, which is $2^N$. For example, for a circuit with the ADC input range equal to 5 volts, the ideal LSB step size for a 10-bit ADC would be 5/1024=4.88 millivolts, or more simply 1.00 LSB.

DNL is the difference between a measured step size and its ideal value. For example, if a 10-bit ADC is measured with 12 bits resolution, then step sizes might have values of 0.0 to 2.0 in increments of 0.25 LSB. If 13 bits of resolution is used, the increment size would be 0.125 LSB. If a step size is measured as 1.75 LSB or 0.25 LSB, then the DNL is 0.75.

Typically, the sizes of all LSB steps are measured for an ADC. DNL having the largest deviation from the ideal value is reported as the maximum DNL. DNL is usually reported in units of LSB.

In the circuit of FIG. 7*b*, the ADC input voltage range is made equal to the feedback logic 1 voltage minus the logic 0 voltage. For example, the logic 1 voltage may equal 5 volts, and the logic 0 voltage may equal 0 volts, and the ADC tested needs to have an input voltage range from 0 to 5 volts.

In general, the circuits in FIGS. 7*a* and 7*b* can test an ADC with any input voltage range within the logic voltage level range, as long as the digital average measured is compared with the maximum digital output expected minus the minimum output expected.

Figure 11:
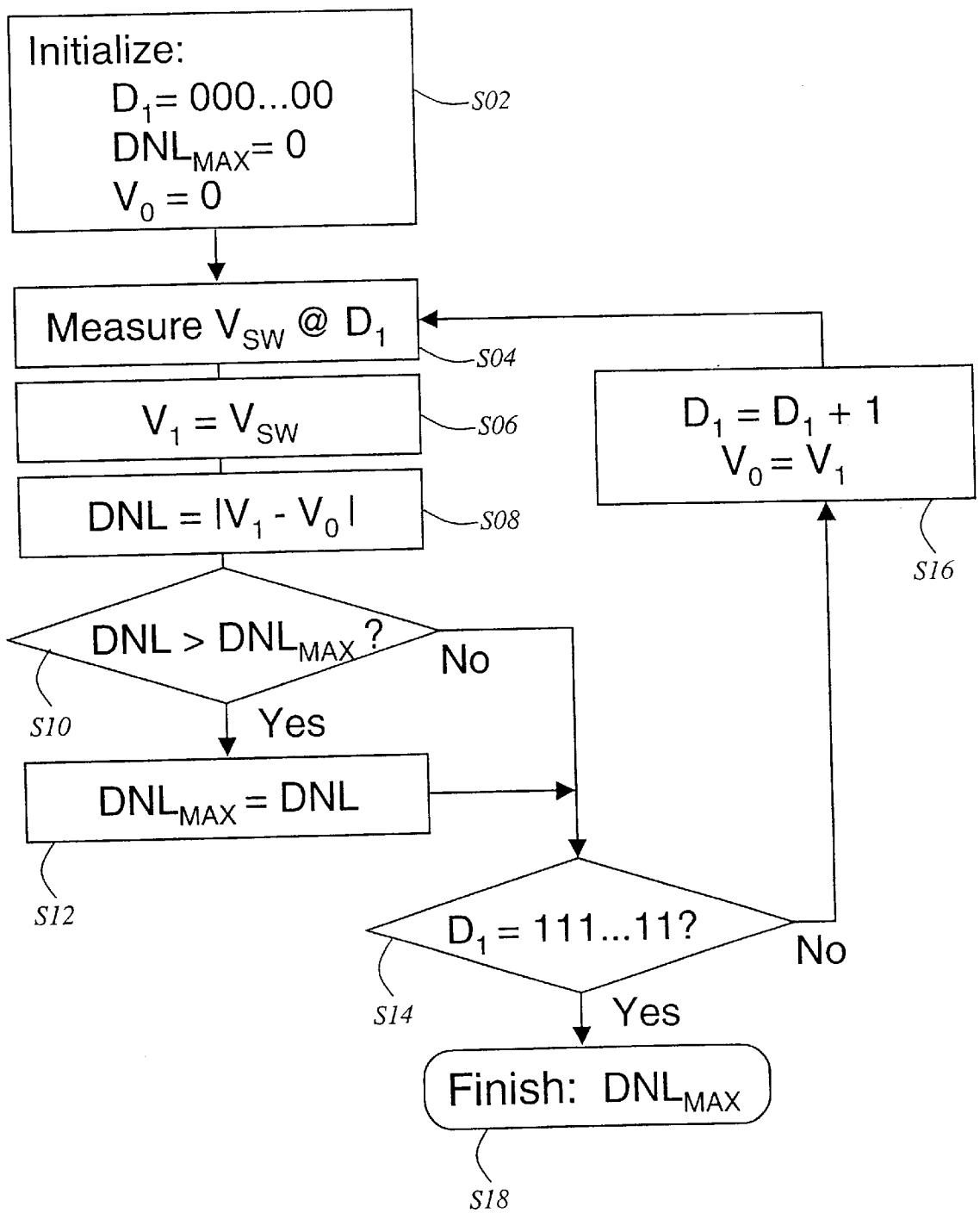
FIG. 11 is a flowchart showing an algorithm for measuring maximum DNL for an ADC.

FIG. 11 shows an example of an algorithm for measuring DNL for an N-bit ADC. The number of clock cycles needed to measure all steps of an N-bit ADC within 0.25 LSB is $2^N \times 2^{N+2} = 2^{2N+2}$. For example, to measure DNL for a 10-bit ADC, all step sizes can be measured in $2^{22}$ clock cycles which is approximately four million clock cycles. For an ADC whose sample rate is 40 MHz, this test takes about 100 milliseconds. For greater accuracy, the accuracy improvement procedure described referring to FIG. 8*a* may be used for each switching point voltage $V_{SW}$ measurement. This increases test time by a factor of three. Additional bits of resolution can be achieved by averaging over more than $2^{N+2}$ clock cycles. Also, additional settling time can be allowed at the start of each step.

As shown in FIG. 11, the measurement starts by initializing the values of the digital reference code $D_1$, $DNL_{MAX}$ and $V_0$ (S02). The test circuit measures a switching point voltage $V_{SW}$ for the reference value $D_1$ (S04). The measured switching point voltage $V_1$ is set equal to $V_{SW}$ (S06). DNL is calculated by subtracting $V_0$ from $V_1$ (S08), and then calculating the absolute value. The circuit compares the calculated DNL to $DNL_{MAX}$ (S10). If the calculated DNL is larger than $DNL_{MAX}$, the $DNL_{MAX}$ is set equal to the DNL (S12). If the reference value $D_1$ is not the maximum digital value possible (S14), the reference value $D_1$ is incremented and $V_0$ is set equal to $V_1$ (S16). The steps S04 to S12 are repeated until the reference value $D_1$ reaches the maximum digital value possible (S14). The circuit thus determines the maximum DNL as the value $DNL_{MAX}$ (S18). The value $DNL_{MAX}$ is equal to a maximum DNL of the ADC plus or minus the resolution of the measurement.

The testing algorithm may be implemented by a subtractor 116, a comparator 117 and a DNL pass/fail determining circuit 118 as shown in FIG. 8b. The subtractor 116 calculates a difference between two digital average values $D_{av}$ measured for two digital values whose $D_1$ difference is one least significant bit (LSB), and subtracts this difference from the ideal value for one LSB. The comparator 117 compares the difference with the other pairs of digital values differing by one LSB to determine the maximum DNL. The determining circuit 118 determines if the ADC passes or fails by comparing the maximum DNL with preset upper and lower limits received from a DNL upper/lower limits input unit 119.

In the above embodiment, the measurement is made for pairs of digital values differing by one LSB. However, in another embodiment, the difference for one pair of digital values may be subtracted from that of another pair of digital values which differ by M LSBs instead of subtracting from the ideal value. In this case, the difference for values differing by M LSBs is first divided by M to get the average difference per LSB. This embodiment tolerates resistances and capacitances whose value is voltage-dependent (i.e. non-linear).

Figure 12A:
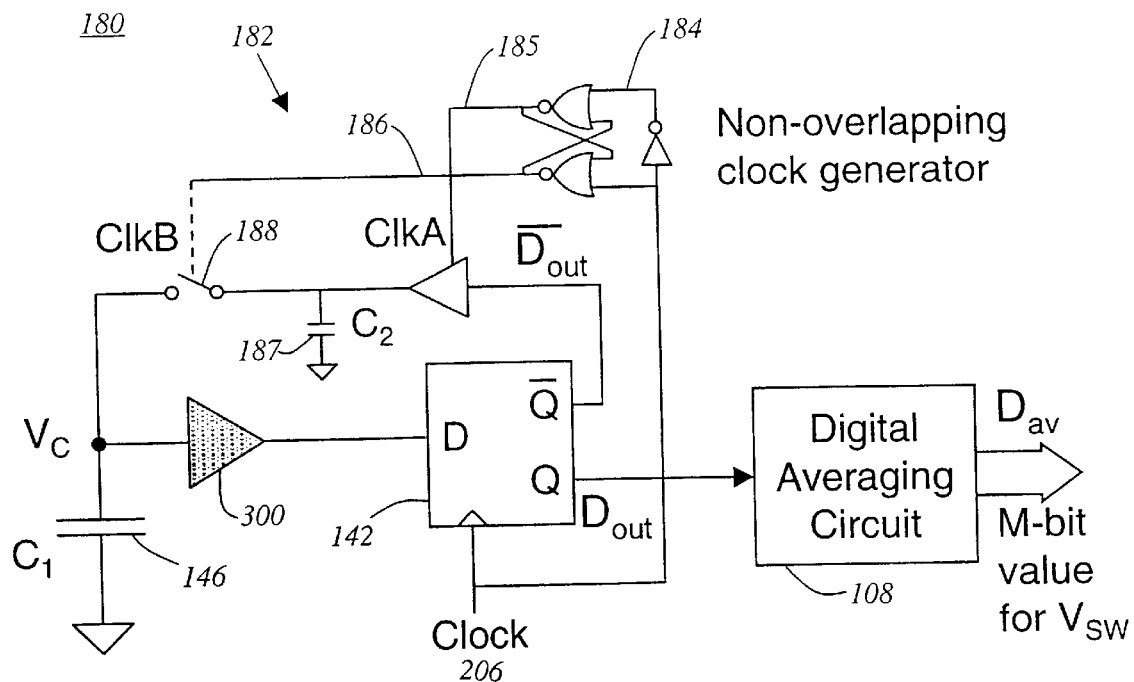
FIG. 12a is a block diagram showing another embodiment of a circuit in accordance with the present invention, using switched capacitance.
Figure 12B:
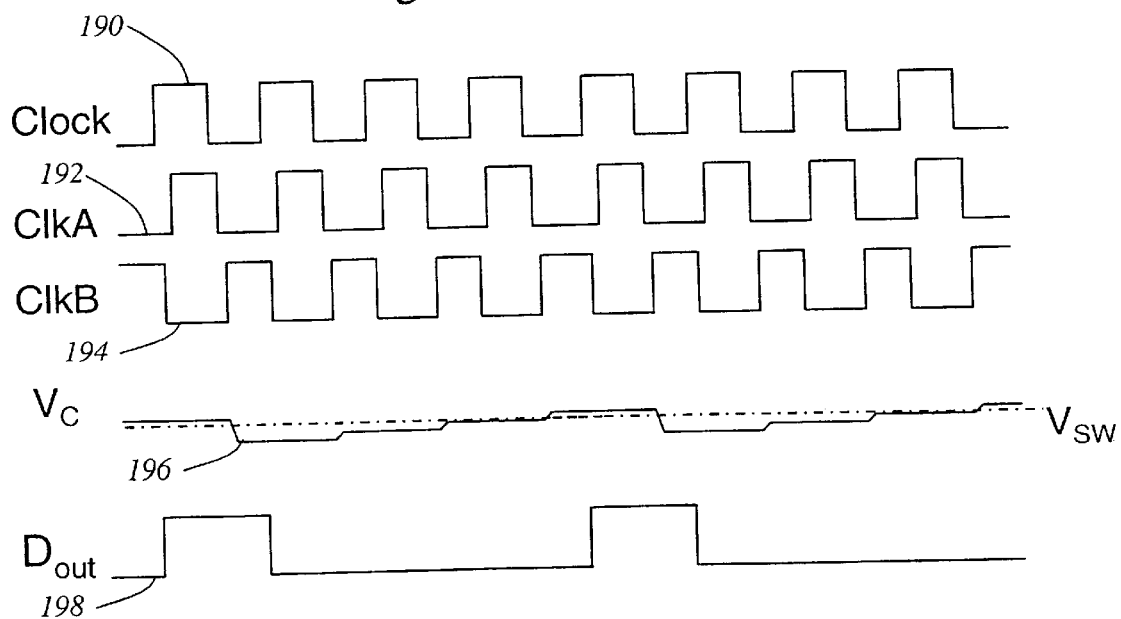

Resistance may be implemented using capacitance, as done in switched capacitor filters. FIG. 12a shows an example of a test circuit 180 which implements a switched capacitor filter 182, instead of the resister 145 used in the test circuit shown in FIG. 9a. The switched capacitor filter 182 uses commonly available digital logic gates. The inverted output value $\overline{D}_{out}$ from the inverted output $\overline{Q}$ of the flip-flop 142 is input to a 3-stage logic gate 183 of the switched capacitor filter 182. The logic gate 183 also receives an enable signal ClkA from one output 185 of a non-overlapping clock generator 184. The output of the logic gate 183 is connected to a capacitor 187 having capacitance $C_2$ and a switch 188. The switch 188 receives a clock ClkB from the other output 186 of the non-overlapping clock generator 184. The waveforms of the clocks Clock, ClkA and ClkB are shown in lines 190, 192 and 194. The test circuit 180 generates waveforms like lines 196 and 198.

To achieve similar resolution to a resistor implementation as shown in FIG. 9a, the ratio of capacitance $C_1$ of the capacitor 146 to the capacitance $C_2$ of the capacitor 187 is preferably set to exceed the number of clock cycles counted. For example, if 8 bits resolution is needed, 256 clock cycles is counted, and therefore the capacitance ratio $C_1/C_2$ is set to be greater than 256. This is not usually practical within an integrated circuit. However, when the capacitor 146 is off-chip, capacitance values of nanofarads are practical. In that case, the capacitor 187 may be on-chip and have a capacitance value of one picofarad or less. In this way, the capacitance ratio $C_1/C_2$ can be arbitrarily high though possibly less accurate than a resistor.

The test circuit of the present invention is suitable for performing Built In Self Test (BIST). In general, BIST requires generation of a stimulus, analysis of the response, and determination of pass or fail status based on specified test limits, with all these functions being implemented in the integrated circuit. BIST for a switching point voltage $V_{SW}$, INL and DNL for an ADC is described hereinafter.

In a BIST circuit for testing a logic gate, to test that the switching point voltage $V_{SW}$ for an ADC is within specified limits, after the switching point voltage $V_{SW}$ for the logic gate has been measured as described in reference with FIG. 9a, the resultant binary-encoded digital value $D_{av}$ can be compared with binary-encoded digital values representing lower and upper limits, using conventional logic circuitry, such as the pass/fail determining circuit 112 shown in FIG. 8b. One bit can be generated for each limit to denote pass or fail.

To test that INL for an ADC is within specified limits, each switching point voltage $V_{SW}$ can be measured and subtracted from its reference code. The result is compared to the lower and upper INL limits. Similarly to the determination of a single value for DNL shown in FIG. 11, to determine a single value for INL, each INL value measured is compared to a stored value $INL_{MAX}$, which is initially set to zero. If the measured value INL is larger than the stored value $INL_{MAX}$, the stored value $INL_{MAX}$ is made equal to the measured value INL. After all values have been measured, the stored value $INL_{MAX}$ will be equal to the largest value INL measured. This largest value $INL_{MAX}$ measured is compared with binary-encoded digital values representing lower and upper limits to determine if the ADC passes or fails. The determination may be done using conventional logic circuitry, such as an INL pass/fail determining circuit 127 shown in FIG. 8b. One bit can be generated for each limit to denote pass or fail.

To test that DNL for an N-bit ADC is within specified limits, each step size can be measured and compared to the lower and upper limits. To determine a single value for DNL, as described referring to FIG. 11, each DNL value measured is compared to a stored value $DNL_{MAX}$ (S10). The stored value $DNL_{MAX}$ is initialized to zero (S02). If the measured value DNL is larger than the stored value $DNL_{MAX}$, the stored value $DNL_{MAX}$ is made equal to the measured value DNL (S12). After all values have been measured (S14), the stored value $DNL_{MAX}$ will be equal to the largest value measured (S18). The largest value measured $DNL_{MAX}$ can be compared with binary-encoded digital values representing lower and upper limits, using conventional logic circuitry, such as the pass/fail determining circuit 118 shown in FIG. 8b. One bit can be generated for each limit to denote pass or fail.

To save test time, the INL and DNL for only those steps associated with changes in the most significant bits (MSBs) may be measured. For example, for a 6-bit ADC, switching point voltages $V_{SW}$ may be measured only for 001111 and 010000, then 011111 and 100000, and finally 101111 and 110000. These three steps are most likely to have the maximum INL and DNL.

To reduce the need for measurement accuracy, when measuring DNL, the MSB step sizes may be compared to the adjacent LSB step sizes. For example, for a 6-bit ADC, the step size for 001111 to 010000, may be compared to the step size for 010000 to 010001. If the difference exceeds a predetermined limit, then a fail bit may be generated.

All of the test circuitry of the present invention, except the resistor and capacitor of the analog averaging circuit, is digital and not sensitive to specific logic delays or layout.

The test circuit may therefore be described in a hardware description language for automatic logic synthesis and layout.

The resistor and capacitor, or capacitor ratio, of the analog averaging circuit need not be accurate. Many implementation methods are possible, such as putting both on the integrated circuit, or putting only the resistor, or only the capacitor on the integrated circuit. The resistor and capacitor may be shared amongst many ADC inputs. Similarly, the feedback path may be on or off the integrated circuit, and may be shared amongst many ADC inputs.

While particular embodiments of the present invention have been shown and described, changes and modifications may be made to such embodiments without departing from the true scope of the invention. For example, the feedback logic value may be changed as long as it provides negative feedback to the analog input voltage.

What is claimed is:

1. A test circuit for measuring a switching point voltage of an N-bit analog-to-digital converter (ADC) having an analog input and a digital output, the test circuit comprising:

a digital comparator for comparing a digital output value from the digital output of the ADC to a predetermined digital value, and generating a first logic value when the digital output value is less than the predetermined value, and a second logic value when the digital output value is equal to or greater than the predetermined value;

an analog averaging circuit for averaging voltages of the first and second digital logic values, and providing an analog average value to the analog input of the ADC such that the analog input of the ADC receives no external analog input signal during the measurement; and a digital averaging circuit for averaging the first and second digital logic values, and generating a digital average value which is representative of the switching point voltage.

2. The test circuit as claimed in claim 1, wherein the digital average value is equal to a ratio of the switching point voltage to a voltage difference between the first and second logic values.

3. The test circuit as claimed in claim 1, wherein the digital averaging circuit comprises a digital counter for counting the number of times that the first logic value is output in a time interval so as to derive the digital average value.

4. The test circuit as claimed in claim 1, wherein the analog averaging circuit comprises a resistor and a capacitor for deriving an analog average value.

5. The test circuit as claimed in claim 1, wherein the analog averaging circuit comprises a switched capacitor and a non-switched capacitor for deriving an analog averaging value.

6. The test circuit as claimed in claim 1, wherein the digital averaging circuit further comprises a correcting circuit for calculating a difference between a first digital average value obtained at a first clock frequency and a second digital average value obtained at a second clock frequency which is higher than the first clock frequency, and correcting the first digital average value in accordance with the calculated difference.

7. The test circuit as claimed in claim 1, wherein the analog averaging circuit accommodates an ADC input voltage range which is different from a voltage difference between the first logic value and the second logic value by altering the first logic value and the second logic value to two constant duty cycles.

8. The test circuit as claimed in claim 1 further comprising a subtractor for subtracting the digital average value measured for a selected reference value from the selected reference value itself;

a comparator for comparing the subtraction result with that for other selected references; and a determining circuit for determining a maximum subtraction result which differs most from zero, wherein the maximum subtraction result is representative of a maximum Integral Non-Linearity (INL) of the ADC.

9. The test circuit as claimed in claim 1 further comprising a subtractor for subtracting a first digital average value measured for a first predetermined digital value from a second digital average value measured for a second predetermined digital value which differs from the first predetermined value by one least significant bit (LSB); and a determining circuit for determining a maximum subtraction result which differs most from an ideal subtraction result, wherein the maximum subtraction result is representative of a maximum Differential Non-Linearity (DNL) of the ADC.

10. The test circuit as claimed in claim 9, wherein the determining circuit determines a maximum subtraction result which instead differs most from 1/M times that for another pair of predetermined digital values differing by M LSBs, wherein M is a positive integer.

11. The test circuit as claimed in claim 1, wherein the test circuit further comprises a sampling circuit for sampling the digital output value of the ADC.

12. The test circuit as claimed in claim 1, wherein the ADC is a logic gate, the digital comparator samples the digital output value of the 1-bit ADC, and the digital feedback circuit is a wire connecting an output of the sampling circuit to the analog averaging circuit.

13. A method for measuring a switching point voltage of an N-bit analog-to-digital converter (ADC) having an analog input and a digital output, the method comprising the steps of:

comparing a digital output value from the digital output of the ADC to a predetermined digital value;

generating a first logic value when the digital output value is less than a predetermined value, and a second logic value when the digital output value is equal to or greater than the predetermined value;

averaging voltages of the first and second logic values to provide an analog average value to the analog input of the ADC such that the analog input of the ADC receives no external analog input signal during the measurement;

averaging the first and second logic values to generate a digital average value which is representative of the switching point voltage.

14. The method as claimed in claim 13 further comprising the step of calculating the switching point voltage by multiplying the digital average value by a voltage difference between the first and second logic values.

15. The method as claimed in claim 13, wherein the step of averaging the first and second logic values comprises the step of counting the number of times that the first logic value is output in a predetermined period so as to derive the digital average value.

16. The method as claimed in claim 13, wherein the step of averaging voltages comprises the step of filtering the voltages of the first and second logic values using a resistor and a capacitor to derive the analog average value.

17. The method as claimed in claim 13, wherein the step of averaging comprises the step of filtering the first and second logic values using a switched capacitor and a non-switched capacitor to derive the analog averaging value.

18. The method as claimed in claim 13, wherein the step of averaging the first and second logic values further comprises the steps of:
   calculating a difference between a first digital average value obtained at a first clock frequency and a second digital average value obtained at a second clock frequency which is higher than the first clock frequency; and
   correcting the first digital average value in accordance with the difference.

19. The method as claimed in claim 13, wherein the step of averaging circuit further comprises the step of accommodating an ADC input voltage range which is different from a voltage difference between the first logic value and the second logic value by altering the first logic value and second logic value to two constant duty cycles.

20. The method as claimed in claim 13 further comprising the steps of:
   subtracting the digital average value measured for a selected reference value from the selected reference value itself;
   comparing the subtraction result with that for other selected references; and
   determining a maximum subtraction result which differs most from zero, wherein the maximum subtraction result is representative of a maximum Integral Non-Linearity (INL) of the ADC.

21. The method as claimed in claim 13 further comprising the steps of:
   subtracting a first digital average value measured for a first predetermined digital value from a second digital average value measured for a second predetermined digital value which differs from the first predetermined value by one least significant bit (LSB); and
   determining a maximum subtraction result which differs most from an ideal subtraction result, wherein the maximum subtraction result is representative of a maximum Differential Non-Linearity (DNL) of the ADC.

22. The method as claimed in claim 21 wherein the maximum subtraction result which differs most from 1/M times that for another pair of predetermined digital values differing by M LSBs, is representative of a maximum DNL of the ADC, wherein M is a positive integer.

23. A test circuit for measuring a switching point voltage of an N-bit analog-to-digital converter (ADC) having an analog input and a digital output, the test circuit comprising:
   a digital comparator for sampling and comparing a digital output value from the digital output of the ADC to a predetermined digital value, and generating a first logic value when the digital output value is less than a predetermined value, and a second logic value when the digital output value is equal to or greater than the predetermined value;
   an analog averaging circuit for averaging voltages of the first and second digital logic values, and providing an analog average value to the analog input of the ADC such that the analog input of the ADC receives no external analog input signal during the measurement;
   a digital averaging circuit for averaging the first and second digital logic values, and generating a digital average value which is representative of the switching point voltage; and
   a correcting circuit for calculating a difference between a first digital average value obtained at a first clock frequency and a second digital average value obtained at a second clock frequency which is higher than the first clock frequency, and correcting the first digital average value in accordance with the calculated difference.

24. A test circuit for measuring a switching point voltage of an N-bit analog-to-digital converter (ADC) having an analog input and a digital output, the test circuit comprising:
   a digital comparator for comparing a digital output value from the digital output of the ADC to a predetermined digital value, and generating a first logic value when the digital output value is less than a predetermined value, and a second logic value when the digital output value is equal to or greater than the predetermined value;
   an analog averaging circuit for averaging voltages of the first and second digital logic values, and providing an analog average value to the analog input of the ADC such that the analog input of the ADC receives no external analog input signal during the measurement;
   a digital averaging circuit for averaging the first and second digital logic values, and generating a digital average value which is representative of the switching point voltage;
   a subtractor for subtracting the digital average value measured for a selected reference value from the selected reference value itself;
   a comparator for comparing the subtraction result with that for other selected references; and
   a determining circuit for determining a maximum subtraction result which differs most from zero, wherein the maximum subtraction result is representative of a maximum Integral Non-Linearity (INL) of the ADC.

25. A test circuit for measuring a switching point voltage of an N-bit analog-to-digital converter (ADC) having an analog input and a digital output, the test circuit comprising:
   a digital comparator for comparing a digital output value from the digital output of the ADC to a predetermined digital value, and generating a first logic value when the digital output value is less than a predetermined value, and a second logic value when the digital output value is equal to or greater than the predetermined value;
   an analog averaging circuit for averaging voltages of the first and second digital logic values, and providing an analog average value to the analog input of the ADC such that the analog input of the ADC receives no external analog input signal during the measurement;
   a digital averaging circuit for averaging the first and second digital logic values, and generating a digital average value which is representative of the switching point voltage;
   a subtractor for subtracting a first digital average value measured for a first predetermined digital value from a second digital average value measure for a second predetermined digital value which differs from the first predetermined value by one least significant bit (LSB); and
   a determining circuit for determining a maximum subtraction result which differs most from an ideal subtraction result, wherein the maximum subtraction result is representative of a maximum Differential Non-Linearity (DNL) of the ADC.

26. The test circuit as claimed in claim 25, wherein the determining circuit determines a maximum subtraction result which instead differs most from 1/M times that for another pair of predetermined digital values differing by M LSBs, wherein M is a positive integer.

27. A method for measuring a switching point voltage of an N-bit analog-to-digital converter (ADC) having an analog input and a digital output, the method comprising of steps of:

comparing a digital output value from the digital output of the ADC to a predetermined digital value;

generating a first logic value when the digital output value is less than a predetermined value, and a second logic value when the digital output value is equal to or greater than the predetermined value;

averaging voltages of the first and second logic values to provide an analog average value to the analog input of the ADC such that the analog input of the ADC receives no external analog input signal during the measurement;

averaging the first and second logic values to generate a digital average value which is representative of the switching point voltage;

calculating a difference between a first digital average value obtained at a first clock frequency and a second digital average value obtained at a second clock frequency which is higher than the first clock frequency; and correcting the first digital average value in accordance with the difference.

28. A method for measuring a switching point voltage of an N-bit analog-to-digital converter (ADC) having an analog input and a digital output, the method comprising the steps of:

comparing a digital output value from the digital output of the ADC to a predetermined digital value;

generating a first logic value when the digital output value is less than a predetermined value, and a second logic value when the digital output value is equal to or greater than the predetermined value;

averaging voltages of the first and second logic values to provide an analog average value to the analog input of the ADC such that the analog input of the ADC receives no external analog input signal during the measurement;

averaging the first and second logic values to generate a digital average value which is representative of the switching point voltage;

subtracting the digital average value measured for a selected reference value from the selected reference value itself;

comparing the subtraction result with that for other selected references; and determining a maximum subtraction result which differs most from zero, wherein the maximum subtraction result is representative of a maximum Integral Non-Linearity (INL) of the ADC.

29. A method for measuring a switching point voltage of an N-bit analog-to-digital converter (ADC) having an analog input and a digital output, the method comprising the steps of comparing a digital output value from the digital output of the ADC to a predetermined digital value;

generating a first logic value when the digital output value is less than a predetermined value, and a second logic value when the digital output value is equal to or greater than the predetermined value;

averaging voltages of the first and second logic values to provide an analog average value to the analog input of the ADC such that the analog input of the ADC receives no external analog input signal during the measurement;

averaging the first and second logic values to generate a digital average value which is representative of the switching point voltage;

subtracting a first digital average value measured for a first predetermined digital value from a second digital average value measured for a second predetermined digital value which differs from the first predetermined value by one least significant bit (LSB); and determining a maximum subtraction result which differs most from an ideal subtraction result, wherein the maximum subtraction result is representative of a maximum Differential Non-Linearity (DNL) of the ADC.

30. The method as claimed in claim 29 wherein the maximum subtraction result which differs most from 1/M times that for another pair of predetermined digital values differing by M LSBs, is representative of a maximum DNL of the ADC, wherein M is a positive integer.

* * * * *